United States Patent
Kim

(10) Patent No.: US 9,348,450 B1
(45) Date of Patent: May 24, 2016

(54) FOLDABLE DISPLAY APPARATUS

(71) Applicant: LG Display Co., Ltd., Seoul (KR)

(72) Inventor: Jun Hyung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/728,509

(22) Filed: Jun. 2, 2015

(30) Foreign Application Priority Data

Dec. 31, 2014 (KR) .................. 10-2014-0195899

(51) Int. Cl.
| | |
|---|---|
| *H05K 7/00* | (2006.01) |
| *G06F 3/041* | (2006.01) |
| *H04M 1/02* | (2006.01) |
| *G06F 1/16* | (2006.01) |
| *H05K 1/02* | (2006.01) |
| *H05K 1/18* | (2006.01) |

(52) U.S. Cl.
CPC ............ *G06F 3/0412* (2013.01); *G06F 1/1616* (2013.01); *G06F 1/1641* (2013.01); *G06F 1/1652* (2013.01); *G06F 1/1681* (2013.01); *G06F 2203/04102* (2013.01); *H04M 1/022* (2013.01); *H04M 1/0216* (2013.01); *H04M 1/0247* (2013.01); *H04M 1/0268* (2013.01); *H05K 1/028* (2013.01); *H05K 1/189* (2013.01); *H05K 2201/2027* (2013.01)

(58) Field of Classification Search
CPC ... G06F 1/1652; G06F 1/1616; G06F 1/1681; G06F 1/1641; H04M 1/0268; H04M 1/0216; H04M 1/022; H04M 1/0247; H05K 1/028; H05K 1/189; H05K 2201/2027
USPC ...................... 361/679.27, 679.3, 749; 349/58
See application file for complete search history.

(56) References Cited

U.S. PATENT DOCUMENTS

| | | |
|---|---|---|
| 6,377,324 B1 | 4/2002 | Katsura |
| 6,577,496 B1 | 6/2003 | Gioscia et al. |
| 6,996,424 B2 | 2/2006 | Ijas et al. |
| 8,248,764 B2 | 8/2012 | Hassemer et al. |
| 8,804,349 B2 | 8/2014 | Lee et al. |
| 8,971,032 B2 | 3/2015 | Griffin et al. |
| 9,013,864 B2 | 4/2015 | Griffin et al. |
| 2003/0026068 A1 | 2/2003 | Tsai et al. |
| 2010/0182738 A1 | 7/2010 | Visser et al. |
| 2010/0201604 A1 | 8/2010 | Kee et al. |
| 2011/0063783 A1 | 3/2011 | Shim |
| 2011/0128216 A1 | 6/2011 | Renwick |
| 2012/0002360 A1 | 1/2012 | Seo et al. |
| 2012/0044620 A1 | 2/2012 | Song et al. |
| 2012/0120618 A1 | 5/2012 | Bohn |
| 2012/0200991 A1 | 8/2012 | Ryu |
| 2012/0236476 A1 | 9/2012 | Wu et al. |
| 2012/0236484 A1 | 9/2012 | Miyake |
| 2012/0314399 A1 | 12/2012 | Bohn et al. |

(Continued)

*Primary Examiner* — Hung S Bui
*Assistant Examiner* — James Wu
(74) *Attorney, Agent, or Firm* — Fenwick & West LLP

(57) ABSTRACT

Embodiment relate to a structure for supporting a bending portion of a flexible display panel in an unfolded state so that the bending portion does not flex when pressed. The structure also enables the bending portion of the flexible display panel to bend at a predetermined curvature in a folded state. The structure includes two rotating plates rotating about two axes that slide relative to flexible supporting members extending from portions of the flexible display panel that do not bend as the flexible display panel is bent. As the flexible display panel is bent, the distance between ends of the rotating plates are increased so that the bending portion of the flexible display panel would have an increased radius of curvature.

18 Claims, 8 Drawing Sheets

(56) References Cited

U.S. PATENT DOCUMENTS

| | | |
|---|---|---|
| 2012/0314400 A1 | 12/2012 | Bohn et al. |
| 2013/0010405 A1* | 1/2013 | Rothkopf et al. ........ 361/679.01 |
| 2013/0021762 A1* | 1/2013 | van Dijk et al. ............. 361/749 |
| 2013/0037228 A1* | 2/2013 | Verschoor et al. ............ 160/377 |
| 2013/0148278 A1 | 6/2013 | Honda |
| 2013/0314611 A1 | 11/2013 | Okutsu et al. |
| 2014/0022714 A1 | 1/2014 | Huang |
| 2014/0029171 A1 | 1/2014 | Lee |
| 2014/0042293 A1* | 2/2014 | Mok et al. ..................... 248/682 |
| 2014/0104765 A1 | 4/2014 | Hoshino |
| 2014/0111954 A1* | 4/2014 | Lee et al. ...................... 361/749 |
| 2014/0126121 A1 | 5/2014 | Griffin et al. |
| 2015/0085433 A1 | 3/2015 | Kim |

* cited by examiner

FOLDABLE DISPLAY APPARATUS

CROSS-REFERENCE TO RELATED APPLICATIONS

This application claims the benefit of the Korean Patent Application No. 10-2014-0195899 filed on Dec. 31, 2014, which is hereby incorporated by reference as if fully set forth herein.

BACKGROUND

1. Field of the Invention

The present invention relates to a foldable display apparatus, and more particularly, to a foldable display apparatus which is bent at a certain curvature or is unfolded to a flat state.

2. Discussion of the Related Art

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

Recently, even in portable electronic devices, the demand for a large screen is increasing, and thus, an apparatus including a display unit displaying a large screen is being developed and commercialized by connecting a flat display panel. In particular, foldable display apparatuses using the merits of a flexible display panel which is bendable or foldable provide portable convenience and include a display unit which displays a large screen, and thus are attracting much attention as next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, tablet PCs.

The foldable display apparatuses are disclosed, for example, in U.S. Patent Publication No. 2012/0044620. The mobile device disclosed in this patent publication unfolds a display with respect to a hinge having a link structure, thereby providing a large screen. However, since the mobile device disclosed in the patent publication cannot maintain a bending area of a folded display in a flat state due to an empty space between links of the hinge, the bending area of the unfolded display is pushed by external pressure, and for this reason, an image is distorted. Also, since the bending area of the display bent at a certain curvature with respect to the hinge is exposed to the outside, the bending area of the display is damaged by an external impact.

SUMMARY

Embodiments relate to a foldable display device that includes a flexible display pane, a first supporting member, a second supporting member, a first rotating plate and a second rotating plate. The flexible display panel includes a first display area, a second display area and a bending display area between the first display area and the second display area. The first supporting member is placed under the first display area and extends below a first portion of the bending display area to provide support for the first portion of the bending display area in an unfolded state of the foldable display device. The second supporting member is placed under the second display area and extends below a second portion of the bending display area to provide support for the second portion of the bending display area in the unfolded state. The edge of the second supporting member under the bending display area is separated from the edge of the first supporting member under the bending display area by a predetermined distance in the unfolded state. The first rotation plate rotates about a first axis and extends towards the edge of the first supporting member to support a portion of the first supporting member in the unfolded state. The second rotation plate rotates about a second axis parallel to the first axis. The second rotation plate extends towards the edge of the second supporting member to support a portion of the second supporting member in the unfolded state. The second rotation plate in conjunction with the first rotation plate causes the bending display area to bend at a predetermined curvature in a folded state of the foldable display device.

In one embodiment, the foldable display device further includes a first case, a second case, a first hinge member and a second hinge member. The first case secures a portion of the first supporting member and the first display area. The second case secures a portion of the second supporting member and the second display area. The first hinge member is secured to the first case. The second hinge member is secured to the second case and is rotatable relative to the first hinge member.

In one embodiment, the foldable display device further includes a hinge cover enclosing at least part of the first hinge member and the second hinge member. The hinge cover includes a first supporter supporting part and a second supporter supporting part. The first supporter supporting part supports the first rotating plate in the unfolded state, and the second supporter supporting part supports the second rotation plate in the unfolded state.

In one embodiment, the first hinge member includes an end formed with a first gear, and the second hinge member includes an end formed with a second gear engaging with the first gear.

In one embodiment, the foldable display device includes a first hinge axis member rotatably connecting the first gear to the hinge cover, and a second hinge axis member rotatably connecting the second gear to the hinge cover.

In one embodiment, the foldable display device further includes a first pin extending along the first axis and rotatably connecting the first rotation plate to the first case, and a second pin extending along the second axis and rotatably connecting the second rotation plate to the second case.

In one embodiment, the first pin extends through the first hinge member and the second pin extends through the second hinge member.

In one embodiment, the distance between the edge of the first supporting member and the edge of the second supporting member increases as the first cover and the second cover are rotated away from the unfolded state.

In one embodiment, the first supporting member slides relative to the first rotation plate and the second support member slides relative to the second rotation plate when the first case is rotated relative to the second case.

In one embodiment, a surface of the first rotation plate supporting the first supporting member and a surface of the second rotation plate supporting the second supporting member are flat.

In one embodiment, the foldable display device further includes first and second supporter fixing structures. The first supporter fixing structure is placed between the first rotation plate and the first case. The first supporter fixing structure applies force to the first rotation plate to rotate in a direction that pulls a portion of the first rotating plate supporting the first supporting member towards a bottom surface of the first case. The second supporter fixing structure is placed between the second rotation plate and the second case. The second supporter fixing structure applies force to the second rotation plate to rotate in a direction that pulls a portion of second rotating plate supporting the second supporting member towards a bottom surface of the second case.

In one embodiment, the first and second supporter fixing structures include a spring or a magnet.

In one embodiment, the foldable display device further includes a first adhesive member, a second adhesive member, a third adhesive member and a fourth adhesive member. The first adhesive member is placed between the first area and a coupling part of the first supporting plate. The second adhesive member is placed between the second area and a coupling part of the second support plate. The third adhesive member is placed between the coupling part of the first supporting plate and a surface of the first case. The fourth adhesive member is placed between the coupling part of the second support plate and a surface of the second case.

In one embodiment, the flexible display panel is placed between the first support member and the second support member in a folded state.

In one embodiment, the first support member and the first rotating plate are integrated into a single body, and the second support member and the second rotating plate are integrated into another single body.

Embodiments also relate to folding or unfolding of a foldable display device. A first display area of a flexible display panel is supported by a first case. A second display area of the flexible display panel is supported by a second case. A first portion of a bending display area between the first display area and the second display area is supported by a first supporting member under the first display area and extending below the first portion of the bending display area in an unfolded state of the foldable display device. A second portion of the bending display area is supported by a second supporting member under the second display area and extending below the second portion of the bending display area in the unfolded state. A first rotating plate supporting a portion of the first supporting member in the unfolded state rotates about a first axis. A second rotation plate that supports a portion of the second supporting member in the unfolded state rotates about a second axis parallel to the first axis. A distance between an edge of the first supporting member and an edge of the second supporting member is increased with rotation of the first case and second case away from the unfolded state to cause the bending display area to bend at a predetermined curvature in a folded state of the foldable display device.

In one embodiment, a first hinge member connected to the first case and a second hinge member connected to the second case are supported by a hinge cover in the unfolded state. The first hinge member engages with the second hinge member during rotation of the first case relative to the second case.

In one embodiment, the first supporting member slides relative to the first rotation plate during rotation of the first case relative to the second case. The second support member slides relative to the second rotation plate during the rotation of the first case relative to the second case.

In one embodiment, force is applied by a first supporter fixing structure to the first rotation plate to rotate the first rotation plate in a direction that pulls a portion of the first rotating plate supporting the first supporting member towards a bottom surface of the first case. Further, force is applied by a second supporter fixing structure to the second rotation plate supporting the second supporting member to rotate the second rotation plate in a direction that pulls a portion of second rotating plate towards a bottom surface of the second case.

In one embodiment, the bending display area of the flexible display panel is placed between the first support member and the second support member in a folded state.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
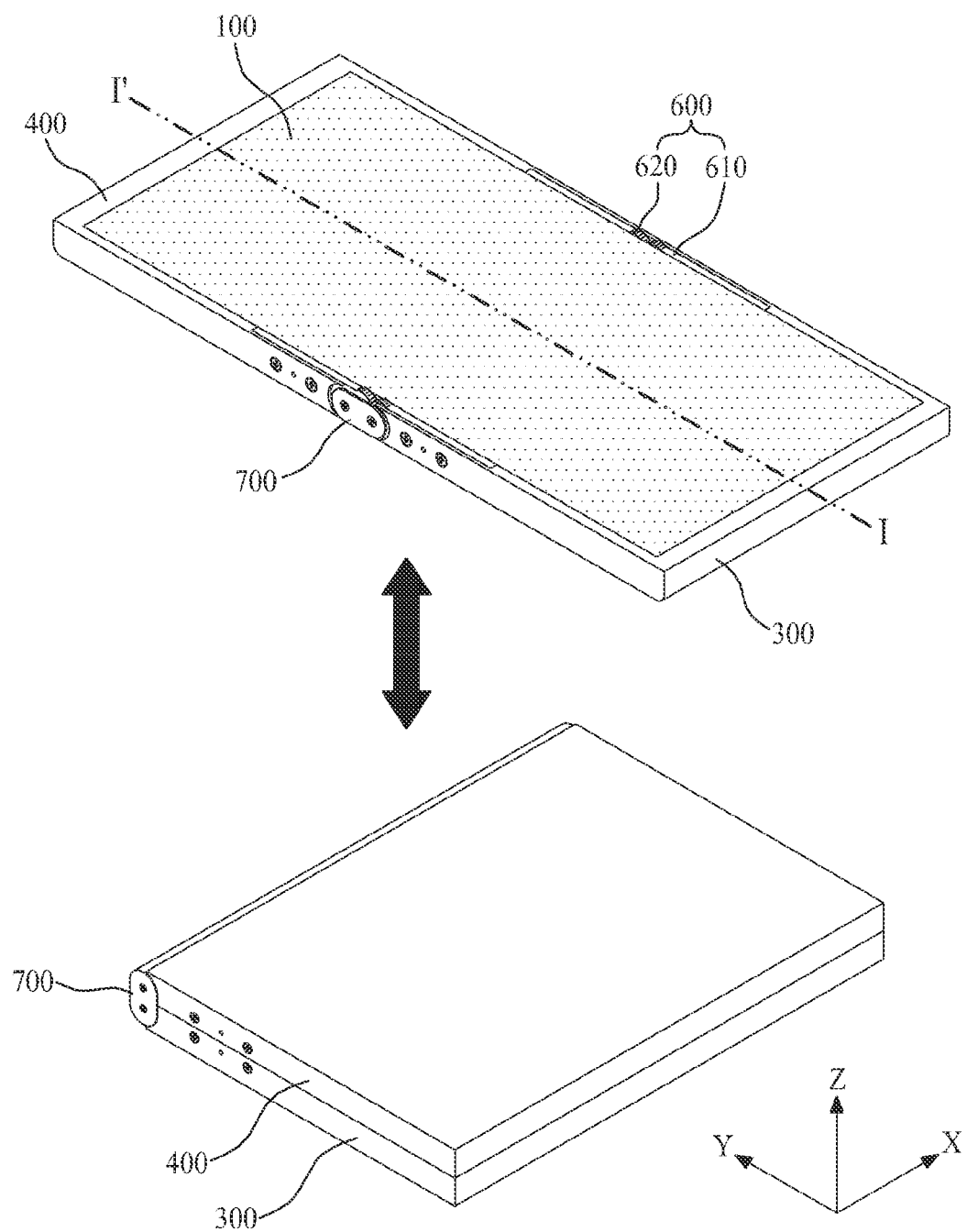
FIG. 1 is a perspective view of a foldable display apparatus in a unfolded flat state and a folded state, according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "on" should be construed as including a case where one element is formed at a top of another element and moreover a case where a third element is disposed therebetween.

Hereinafter, exemplary embodiments of a foldable display apparatus according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
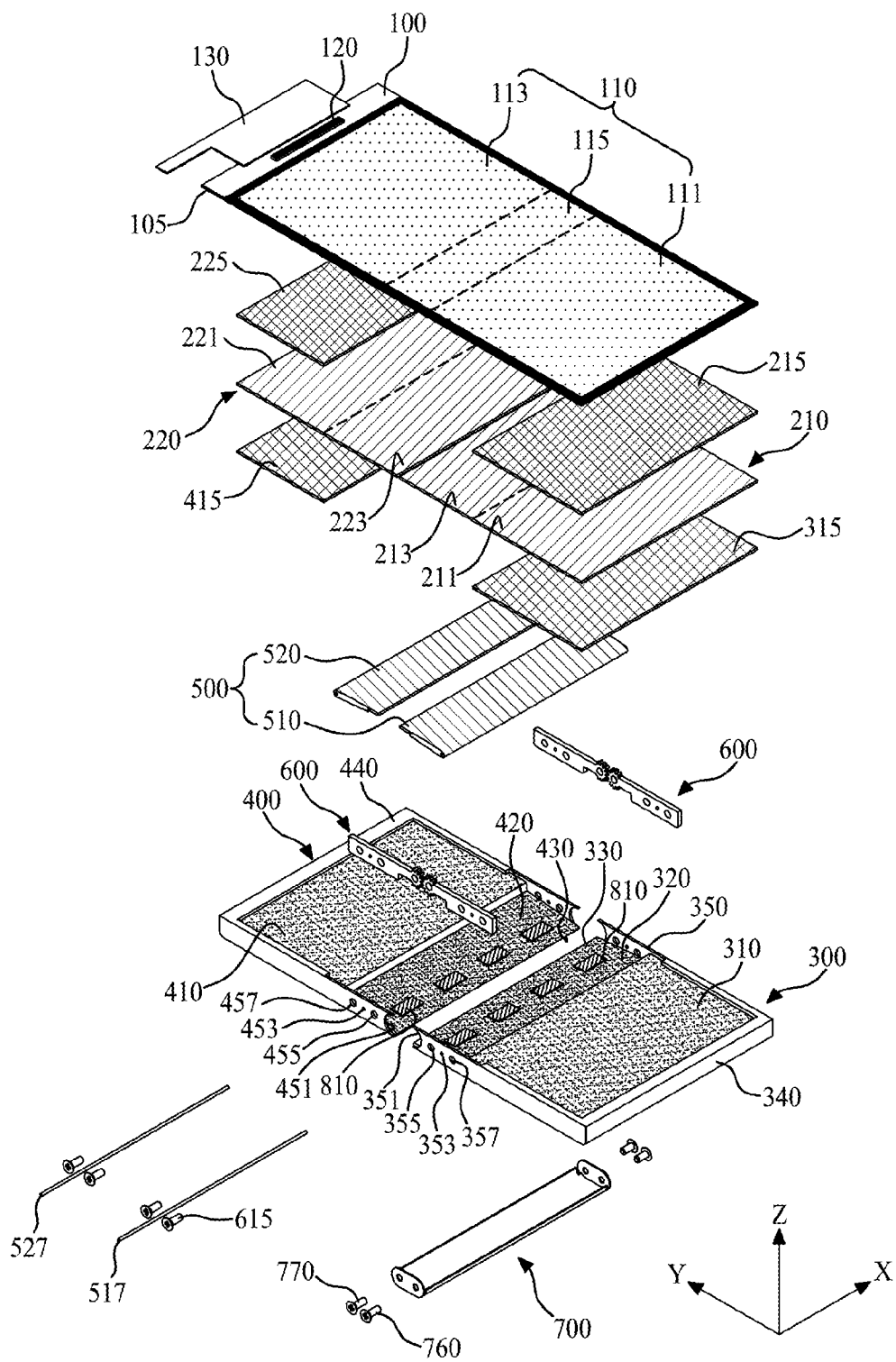
FIG. 2 is an exploded perspective view of a foldable display apparatus according to an embodiment of the present invention.
Figure 3:
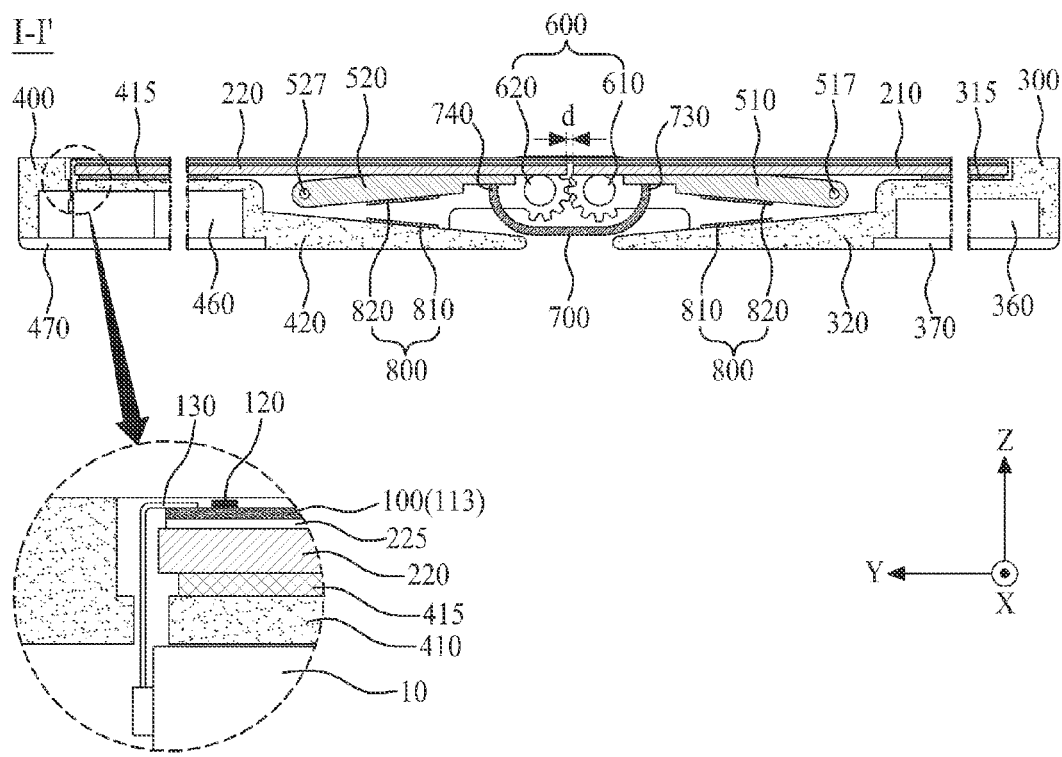
FIG. 3 is a cross-sectional view illustrating a cross-sectional surface taken along line I-I' of FIG. 1.

FIG. 1 is a perspective view of a foldable display apparatus in a unfolded flat state and a folded state, according to an embodiment of the present invention. FIG. 2 is an exploded perspective view of a foldable display apparatus according to an embodiment of the present invention. FIG. 3 is a cross-sectional view illustrating a cross-sectional surface taken along line I-I' of FIG. 1. Referring to FIGS. 1 through 3, the foldable display apparatus according to an embodiment of the present invention includes a display panel 100, a first supporting plate 210, a second supporting plate 220, a first case 300, a second case 400, a supporter 500, a hinge 600, and a hinge cover 700.

The display panel 100 may be a flexible display panel using a flexible substrate. For example, the display panel 100 may be a flexible organic light emitting display panel, a flexible electrophoretic display panel, a flexible liquid crystal display panel, or a flexible electro-wetting display panel.

The display panel 100 may include a flexible pixel array substrate, which includes an active matrix type pixel array, and an encapsulation member which protects the pixel array.

The flexible pixel array substrate may be formed of a plastic material or a metal foil. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

The pixel array includes a plurality of pixels. Each of the pixels is provided in a plurality of pixel areas defined adjacent to intersection areas of a plurality of gate lines and a plurality of data lines. Each of the plurality of pixels includes a display device that displays an image corresponding to an image signal. The display device may be an organic light emitting device, a liquid crystal display device, an electrophoretic device, or an electro-wetting display device.

When the display device is the organic light emitting device or the electrophoretic device, the encapsulation member according to an embodiment is formed on a flexible substrate to cover a pixel array, and may be a flexible encapsulation substrate or an encapsulation layer. When the display device is the liquid crystal display device, the electro-wetting display device, or the electrophoretic device, an encapsulation member according to another embodiment may be a flexible color filter substrate that includes a color filter corresponding to a pixel.

In addition, the display panel 100 may further include a polarizing film attached to the encapsulation member, but the polarizing film may be omitted depending on an image realization method of the display panel 100.

The foldable display apparatus according to an embodiment of the present invention may further include a touch screen (not shown) for a user interface using a user's touch. The touch screen may be attached onto the display panel 100, or may be built into the display panel 100 in a process of forming the pixel array.

The display panel 100 includes a display area 110 displaying an image by the pixel array having the plurality of pixels. The display area 112 may be divided into a first area 111, a second area 113, and a bending area 115.

The first area 111 may be defined as a part (for example, an upper area) of the display panel 100 which is disposed at one side of the bending area 115 in the display area 110, and the second area 113 may be defined as another part (for example, a lower area) of the display panel 100 which is disposed at the other side of the bending area 115 in the display area 110.

When the display panel 100 is unfolded into a flat state, the first and second areas 111 and 113 and the bending area 115 may constitute one the display area 110, thereby providing a relatively broad screen.

The display panel 100 may be supported by a flexible supporting plate 105. The flexible supporting plate 105 may be attached to an entire rear surface of the display panel 100 and may maintain the flexible display panel 100 in a flat state. The flexible supporting plate 105 may be omitted depending on a flexible characteristic of the flexible pixel array substrate.

In addition, the foldable display apparatus according to an embodiment of the present invention may further include a display driving integrated circuit (IC) 120 and a flexible circuit film 130.

The display driving IC 120 may be attached to a chip mounting area which is provided in the display panel 100 by a chip bonding process, and may display an image on the plurality of pixels according to a signal supplied through a display pad part.

The flexible circuit film 130 may be attached to the display pad part which is provided in the display panel 110 and may transfer a signal, supplied from an external driving system, and various powers to the display driving IC 120. The flexible circuit film 130 may be provided as a tape carrier package (TCP), a chip on flexible board or a chip on film (COF), or a flexible printed circuit (FPC). One end of the flexible circuit film 130 may be attached to the display pad part, and the other end of the flexible circuit film 130 may be bent inward into the second case 400 to surround a side of the second supporting plate 220 and may be connected to a driving system 10 which is accommodated in the second case 400.

The first supporting plate 210 may support one side of the bending area 115 of the display panel 100 and a first area 111 of the display panel 100. In this case, except one portion of the first supporting plate 210 overlapping with the supporter 500, the other portion of the first supporting plate 210 may be physically coupled to a rear surface of the display panel 100 in order to bend the display panel 100.

The first supporting plate 210 according to an embodiment may be divided into a first panel coupling part 211 (which is physically coupled to a rear surface of the first area 111 by a first adhesive member 215 except for an inner edge of the first area 111 adjacent to the bending area 115 in the first area 111 of the display panel 100), and a first panel supporting part 213 (selectively supporting one side of the bending area 115 adjacent to the first area 111 of the display panel 100 and the inner edge of the first area 111). The first panel coupling part 211 may maintain the first area 111 of the display panel 100 in a flat state, and when the display panel 100 is unfolded, the first panel supporting part 213 may support one side of the bending area 115 of the display panel 100. When the display panel 100 is folded, the first panel supporting part 213 may be bent at a certain angle to bend the bending area 115 of the display panel 100 at a predetermined curvature.

The first supporting plate 210 according to an embodiment may be formed of a plastic material having an elastic force. That is, the first supporting plate 210 according to an embodiment may be formed of a flexible plastic material, which is flexible and has an elastic force, so as to be bent by a bending force of the bending area 115 when the display panel 100 is folded.

The second supporting plate 220 may support the other side of the bending area 115 of the display panel 100 and a second area 113 of the display panel 100. In this case, except one portion of the second supporting plate 220 overlapping with the supporter 500, the other portion of the second supporting plate 220 may be physically coupled to the rear surface of the display panel 100 in order to bend the display panel 100.

The second supporting plate 220 according to an embodiment may be divided into a second panel coupling part 221 (which is physically coupled to a rear surface of the second area 113 by a second adhesive member 225 except an inner edge of the second area 113 adjacent to the bending area 115 in the second area 113 of the display panel 100), and a second panel supporting part 223 (which selectively supports the other side of the bending area 115 adjacent to the second area 113 of the display panel 100 and the inner edge of the second area 113). The second panel coupling part 221 may maintain the second area 113 of the display panel 100 in a flat state, and when the display panel 100 is unfolded, the second panel supporting part 223 may support the other side of the bending area 115 of the display panel 100. When the display panel 100 is folded, the second panel supporting part 223 may be bent at a certain angle to bend the bending area 115 of the display panel 100 at a predetermined curvature.

The second supporting plate 220 according to an embodiment may be formed of a plastic material having an elastic force. That is, the second supporting plate 220 according to an embodiment may be formed of a flexible plastic material, which is flexible and has an elastic force, so as to be bent by the bending force of the bending area 115 when the display panel 100 is folded.

As illustrated in FIG. 3, the first and second panel supporting plates 210, 220 may be parallel to each other and be separated from each other by a separation distance "d" under the bending area 115 of the display panel 100 in the unfolded state. The distance between the first and second panel supporting plates 210, 220 increases as the display panel 100 is folded. Therefore, the separation distance "d" between the first and second panel supporting plates 210, 220 is minimum in the unfolded state. The first and second panel plates 210, 220 may support the bending area 115 of the display panel 100 in the unfolded flat state. When the separation distance "d" between the first and second panel supporting plates 210, 220 is relatively large, the bending area 115 over empty space between the first and second panel supporting plates 210, 220 may flex when external pressure is applied to the bending area 115. Such flexing of the bending area 115 may cause a distortion of an image displayed in the bending area 115. Therefore, it is advantageous to reduce the separation distance "d" between the first and second panel supporting plates 210, 220 overlapping with the bending area 115 of the display panel 100 but not too small so that they come into contact.

The first case 300 may support the first supporting plate 210 and the supporter 500, and surround each side of the first area 111 of the display panel 100. The first case 300 according to an embodiment may include a first inner bottom 310, a second inner bottom 320, a lower wall 330, an upper wall 340, and both side walls 350.

The first inner bottom 310 of the first case 300 may support a portion of the first supporting plate 210. That is, the first inner bottom 310 may be coupled to the first panel coupling part 211 of the first supporting plate 210 by a third adhesive member 315. Therefore, the first panel coupling part 211 of the first supporting plate 210 may be fixed to the first inner bottom 310.

The second inner bottom 320 of the first case 300 may be stepped down by a certain depth from the first inner bottom 310 and may overlap with the first panel supporting part 213 of the first supporting plate 210. The second inner bottom 320 may be inclined downward from an end of the first inner bottom 310 to the lower wall 330. Since the second inner bottom 320 is stepped down from the first inner bottom 310, a rotation space which enables the first panel supporting part 213 of the first supporting plate 210 to be bent at a certain angle and enables one side of the supporter 500 to rotate at a certain angle may be formed.

The lower wall 330 of the first case 300 may be a lower inner surface of the first case 300 and adjacent to the bending area 115 of the display panel 100.

The upper wall 340 of the first case 300 may be an upper outer surface of the first case 300 which is parallel to an upper surface of the display panel 100, and may surround the first supporting plate 210 and an upper surface of the first area 111 of the display panel 100.

Both side walls 350 of the first case 300 may be vertically provided to have a certain height from both sides of the first and second inner bottoms 310 and 320 and may surround the first supporting plate 210 and both sides of the first area 111 of the display panel 100. In this case, a first arc part 351 which is recessed to have a certain curvature may be provided in an end of each of the both side walls 350 adjacent to the bending area 115 of the display panel 100. Also, an inner side of each of the both side walls 350 which are respectively provided on both sides of the second inner bottoms 320 may act as a first supporting side wall that supports each of the supporter 500 and the hinge 600. A first pin supporting hole 353 and two or more first screw holes 355 and 357 may be provided in the inner side of each of the both side walls 350.

The second case 400 may support the second supporting plate 220 and the supporter 500, and surround each side of the second area 113 of the display panel 100. The second case 400 according to an embodiment may include a third inner bottom 410, a fourth inner bottom 420, an upper wall 430, a lower wall 440, and both side walls 450.

The third inner bottom 410 of the second case 400 may support a portion of the second supporting plate 220. That is, the third inner bottom 410 may be coupled to the second panel coupling part 221 of the second supporting plate 220 by a fourth adhesive member 415. Therefore, the second panel coupling part 221 of the second supporting plate 220 may be fixed to the third inner bottom 410.

The fourth inner bottom 420 of the second case 400 may be stepped down by a certain depth from the second inner bottom 410 and may overlap with the second panel supporting part 223 of the second supporting plate 220. In this case, the fourth inner bottom 420 may be inclined downward from an end of the third inner bottom 410 to the upper wall 430. Since the fourth inner bottom 420 is stepped down from the third inner bottom 410, a rotation space which enables the second panel supporting part 223 of the second supporting plate 220 to be bent at a certain angle and enables one side of the supporter 500 to rotate at a certain angle may be formed.

The upper wall 430 of the second case 400 may be an upper inner surface of the second case 400 adjacent to the bending area 115 of the display panel 100.

The lower wall 440 of the second case 400 may be a lower outer surface of the second case 400 which is parallel to a lower surface of the display panel 100, and may surround the second supporting plate 220 and a lower surface of the second area 113 of the display panel 100.

The both side walls 450 of the second case 400 may be vertically provided to have a certain height from both sides of the third and fourth inner bottoms 410 and 420 and may surround the second supporting plate 220 and both sides of the second area 113 of the display panel 100. In this case, a second arc part 451 which is recessed to have a certain curvature may be provided in an end of each of the both side walls 450 adjacent to the bending area 115 of the display panel 100. Also, an inner side of each of the both side walls 450 which are respectively provided on both sides of the fourth inner bottoms 420 may act as a second supporting side wall that supports each of the supporter 500 and the hinge 600. A second pin supporting hole 453 and one or more second screw holes 455 and 457 may be provided in the inner side of each of the both side walls 450.

In addition, accommodation space 460 which accommodates the driving system 10, a battery, and electronic elements necessary for driving of the foldable display apparatus may be provided in a rear surface of the second case 400 and may be sealed or opened by a rear cover 470. Also, an auxiliary accommodation space 360 which accommodates the electronic elements necessary for driving of the foldable display apparatus may be provided in a rear surface of the first case 300 and may be sealed or opened by an auxiliary rear cover 370.

The supporter 500 may be provided in each of the first and second cases 300 and 400. The supporter 500 may selectively support inner sides of the first and second supporting plates 210 and 220 overlapping with the bending area 115 of the display panel 100. That is, the supporter 500 may rotate to a panel supporting position or an avoidance position in response to a curvature change of the bending area 115 caused by rotations of the first and second cases 300 and 400, and thus may support the first panel supporting part 213 of the first supporting plate 210 and the second panel supporting part 223 of the second supporting plate 220 in a flat state or allow the first and second panel supporting parts 213 and 223 to be bent at a certain angle or a certain curvature. The supporter 500 may include first and second rotation plates 510 and 520.

Figure 4:
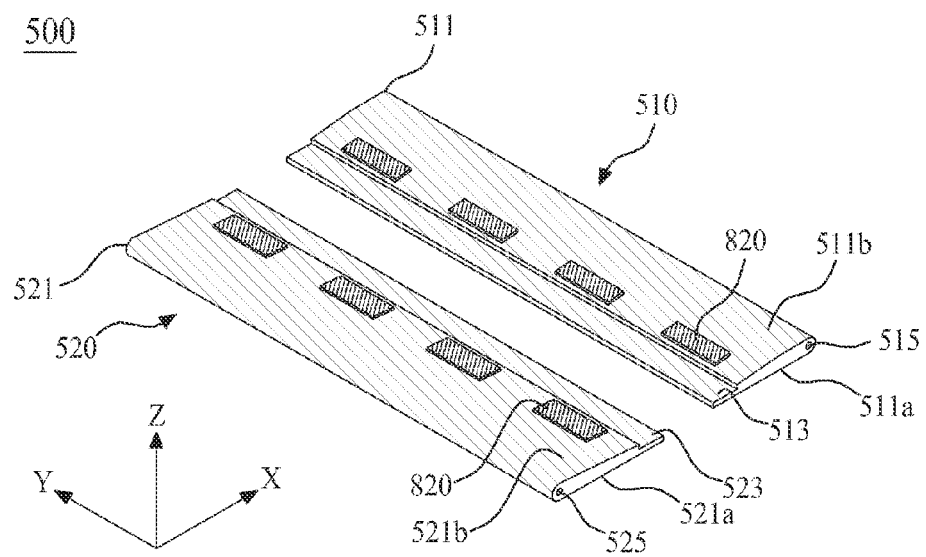
FIG. 4 is a rear view of supporters according to an embodiment of the present invention.

The first rotation plate 510 may be rotatably provided in the first case 300 to overlap with the first panel supporting part 213. The first rotation plate 510 may be supported by the hinge cover 700 when the display panel 100 is unfolded along a first rotation direction of the first case 300. With the first rotation plate 510 supported by the hinge cover 700 according to the first rotation direction of the first case 300, the first rotation plate 510 may rotate to the panel supporting position and support the first panel supporting part 213. Also, in response to a curvature change of the bending area 115 which is caused when the display panel 100 is folded according to a second rotation direction opposite to the first rotation direction of the first case 300, the first rotation plate 510 may be released from a state of being supported by the hinge cover 700 and may rotate from the panel supporting position to the avoidance position, thereby allowing the first panel supporting part 213 to be bent. The first rotation plate 510 according to an embodiment, as illustrated in FIG. 4, may include a first body 511, a first stepped part 513, and a first pin insertion hole 515.

The first body 511 may have a rectangular shape and include a boat-shaped cross-sectional surface that includes a top 511a which is flat and a bottom 511b which is curved. That is, the top 511a of the first body 511 may be a planar surface for supporting the first panel supporting part 213 of the first supporting plate 210 in a flat state. Also, the bottom 511b of the first body 511 may be a curved surface for increasing a rotation angle of the first rotation plate 510.

The first stepped part 513 is stepped down from the bottom 511b on the bottom 511b of the first body 511. The bottom 511b of the first body 511 may be defined as a part that overlaps with an inner edge of the first body 511 with respect to the hinge 600. The first stepped part 513 may be provided adjacent to the second rotation plate 520. When a rotation trajectory of the first rotation plate 510 overlaps with the hinge cover 700, the first stepped part 513 may be supported by the hinge cover 700. When the rotation trajectory of the first rotation plate 510 does not overlap with the hinge cover 700, the first stepped part 513 may be separated from the hinge cover 700.

The first pin insertion hole 515 may be provided to pass through an outer edge of the first body 511 in a length direction of the first body 511. The first pin insertion hole 515 may act as a rotation axis of the first rotation plate 510.

The first rotation plate 510 may be provided in the first case 300 to be rotatable about a first pin 517 inserted into the first pin insertion hole 515. The first rotation plate 510 may rotate to the avoidance position with the first pin 517 as a rotation axis according to the rotation of the first case 300 or rotate to the panel supporting position where the first rotation plate 510 is supported by the hinge cover 700, and thus support the first panel supporting part 513 or allow the first panel supporting part 513 to be bent at a certain angle. The first pin 517 may be inserted into the first pin insertion hole 515, and both ends of the first pin 517 may be supported by the first pin supporting hole 353 which is provided in the first case 300 and may rotatably support an outer edge of the first rotation plate 510.

The second rotation plate 520 may be rotatably provided on the fourth inner bottom 420 of the second case 400. The second rotation plate 520 may be supported by the hinge cover 700 when the display panel 100 is unfolded along a second rotation direction of the second case 400, and with the second rotation plate 520 being supported by the hinge cover 700 according to the second rotation direction of the second case 400, the second rotation plate 520 may rotate to the panel supporting position and support the second panel supporting part 223. Also, in response to a curvature change of the bending area 115 which is caused when the display panel 100 is folded according to a first rotation direction opposite to the second rotation direction of the second case 400, the second rotation plate 520 may be released from a state of being supported by the hinge cover 700 and may rotate from the panel supporting position to the avoidance position, thereby allowing the second panel supporting part 223 to be bent. The second rotation plate 520 according to an embodiment, as illustrated in FIGS. 2 and 4, may include a second body 521, a second stepped part 523, and a second pin insertion hole 525.

The second body 521 may have a rectangular shape and include a boat-shaped cross-sectional surface that includes a top 521a which is flat and a bottom 521b which is curved. That is, the top 521a of the second body 521 may be a planar surface for supporting the second panel supporting part 223 of the second supporting plate 220 in a flat state. Also, the bottom 521b of the second body 521 may be a curved surface for increasing a rotation angle of the second rotation plate 520.

The second stepped part 523 is stepped down from the bottom 521b of the second body 521. Here, the bottom 521b of the second body 521 may be defined as a part which overlaps with an inner edge of the second body 521 with respect to the hinge 600. The second stepped part 523 may be provided adjacent to the first rotation plate 510. When a rotation trajectory of the second rotation plate 520 overlaps with the hinge cover 700, the second stepped part 523 may be supported by the hinge cover 700. When the rotation trajectory of the second rotation plate 520 does not overlap with the hinge cover 700, the second stepped part 523 may be separated from the hinge cover 700.

The second pin insertion hole 525 may be provided to pass through an outer edge of the second body 521 in a length direction of the second body 521. The second pin insertion hole 525 may act as a rotation axis of the second rotation plate 520.

The second rotation plate 520 may be provided in the second case 400 to be rotatable about a second pin 527 inserted into the second pin insertion hole 525. The second rotation plate 520 may rotate to the avoidance position with the second pin 527 as a rotation axis according to rotation of the second case 400 or rotate to the panel supporting position where the second rotation plate 520 is supported by the hinge cover 700, and thus may support the second panel supporting part 523 or allow the second panel supporting part 523 to be bent at a certain angle. The second pin 527 may be inserted into the second pin insertion hole 525, and both ends of the second pin 527 may be supported by the second pin supporting hole 453 which is provided in the second case 400 and may rotatably support an outer edge of the second rotation plate 520.

Figure 5:
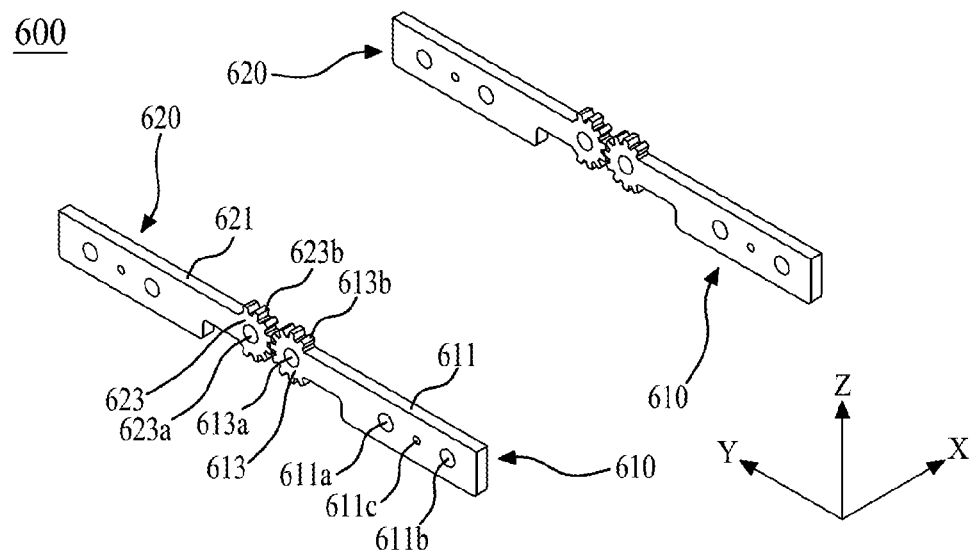
FIG. 5 is a perspective view of hinges according to an embodiment of the present invention.

Referring again to FIGS. 1 through 3, the hinge 600 may be provided between the first and second cases 300 and 400 and allows the first and second cases 300 and 400 to rotate relative to each other. Particularly, the hinge 600 may adjust a rotation angle of each of the first and second cases 300 and 400 rotating relative to each other. The hinge 600 according to an embodiment, as illustrated in FIGS. 2 and 5, may include a pair of first hinge members 610 and a pair of second hinge members 620.

The pair of first hinge members 610 may be coupled to a first supporting side wall of the first case 300 and enables the first case 300 to rotate. Each of the pair of first hinge members 610 according to an embodiment may include a first hinge fixing part 611 and a first rotation part 613.

The first hinge fixing part 611 may have a tetragonal plate shape. The first hinge fixing part 611 may be coupled to an inner side of the first supporting side wall by two or more first screws 615. To this end, two or more first screw coupling holes 611a and 611b to which the two or more first screws 615 are respectively coupled may be provided in the first hinge fixing part 611. The two or more first screws 615 may be respectively inserted into two or more first screw holes 355 and 357 which are provided in the first supporting side wall, and may be respectively coupled to the two or more first screw coupling holes 611a and 611b, thereby fixing the first hinge fixing part 611 to the inner side of the first supporting side wall.

A first pin supporting hole 611c, into which the first pin 517 is inserted, may be provided in the first hinge fixing part 611. Both ends of the first pin 517 may pass through the first pin supporting hole 611c and may be inserted into the first pin supporting hole 353 which is provided in the first supporting side wall of the first case 300. As a result, the first pin 517 may be rotatably supported by the first hinge fixing part 611 and the first supporting side wall of the first case 300.

The first rotation part 613 may be provided in the first hinge fixing part 611 and may act as a rotation axis about which the first case 300 rotates. The first rotation part 613 according to an embodiment has a circle-shaped cross-sectional surface and is provided on an inner edge of the first hinge fixing part 611. A first hinge supporting hole 613a passing through the inner edge of the first hinge fixing part 611 along the thickness direction of the first hinge fixing part 611 may be provided at the center of the first rotation part 613. A plurality of first gear threads 613b having a certain pitch may be provided along the circumference of the first rotation part 613.

The pair of second hinge members 620 may be coupled to a second supporting side wall of the second case 400 and enables the second case 400 to rotate and has the same structure as the pair of first hinge members 620. Therefore, detailed description of the pair of second hinge members 620 is omitted herein for the sake of brevity.

Figure 6:
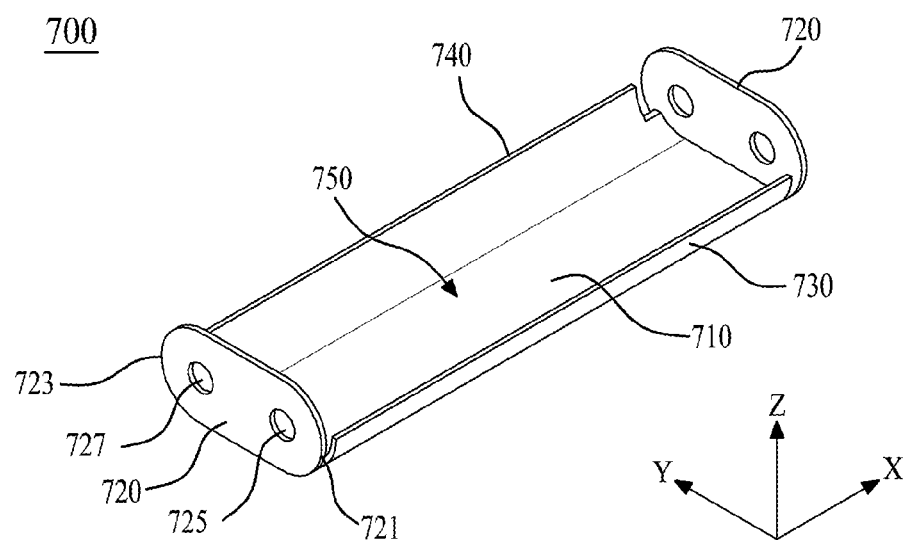
FIG. 6 is a perspective view of a hinge cover according to an embodiment of the present invention.

Referring again to FIGS. 1 through 3, the hinge cover 700 may be disposed between the first and second cases 300 and 400. The hinge cover 700 may rotatably support the hinge 600 and cover a side of the hinge 600 and the space between the first and second cases 300 and 400, thereby protecting the hinge 600. Also, the hinge cover 700 may support the supporter 500 in the unfolded state, and accommodate inner edges of the first and second supporting plates 210 and 220 which are rotated to the avoidance position. The hinge cover 700 according to an embodiment, as illustrated in FIGS. 2 and 6, may include a bottom cover part 710, a pair of hinge supporting parts 720, a first supporter supporting part 730, a second supporter supporting part 740, and an accommodation part 750.

The bottom cover 710 may have a tetragonal plate shape which overlaps with the bending area 115 of the display panel 100. The bottom cover 710 may cover rear space between the first and second cases 300 and 400.

The pair of hinge supporting parts 720 may be extend vertically from both sides of the bottom cover part 710 in parallel. The pair of hinge supporting parts 720 may rotatably support the hinge 600 and cover the hinge 600 and both sides between the first and second cases 300 and 400.

First and second rounding parts 721 and 723, which are convexly rounded at a certain curvature, may be provided on both sides of the pair of hinge supporting parts 720 with respect to the length direction Y of the display panel 100. A first rounding part 721 may be inserted into a first arc part 351 which is provided on the both side walls 350 of the first case 300, and a second rounding part 723 may be inserted into a second arc part 451 which is provided on the both side walls 450 of the second case 400. In this case, the first and second rounding parts 721 and 723 and the first and second arc parts 351 and 451 may have the same curvature.

Third and fourth hinge supporting holes 725 and 727 may be formed in the pair of hinge supporting parts 720.

The third hinge supporting hole 725 may be provided to align with a first hinge supporting hole 613a, which is provided in the first rotation part 613 of the pair of first hinge members 610, and to pass through one side of the pair of hinge supporting parts 720. A first hinge axis member 760 may be inserted into the third hinge supporting hole 725. The first hinge axis member 760 may be inserted into the third hinge supporting hole 725 and the first hinge supporting hole 613a and may rotatably support the first rotation part 613 of the pair of first hinge members 610, whereby the first hinge axis member 760 may act as a rotation axis about which the first case 300 rotates.

The fourth hinge supporting hole 727 may be provided to align with a second hinge supporting hole 623a, which is provided in the second rotation part 623 of the pair of second hinge members 620, and to pass through the other side of the pair of hinge supporting parts 720. A second hinge shaft member 770 may be inserted into the fourth hinge supporting hole 727. The second hinge axis member 770 may be inserted into the fourth hinge supporting hole 727 and the second hinge supporting hole 623a and may rotatably support the second rotation part 623 of the pair of second hinge members 620, whereby the second hinge axis member 770 may act as a rotation axis about which the second case 400 rotates.

The first supporter supporting part 730 may curl vertically upward from one side edge of the bottom cover part 710. The first supporter supporting part 730 may be provided in a curved shape having the same curvature as that of the first rounding part 721 which is provided in the pair of hinge supporting parts 720. When in the unfolded state, the first support supporting part 730 contacts the first stepped surface 513 and restricts the first rotation plate 510 from rotating beyond the unfolded state in the direction opposite to the unfolding direction. The first supporter supporting part 730 may have a height corresponding to a height between a first stepped surface 513 (see FIG. 4) of the first rotation plate 510, which is rotated to the panel supporting position, and the bottom cover part 710. The first supporter supporting part 730 may support the first stepped surface 513 of the first rotation plate 510 and rotate the supported first rotation plate 510 to the panel supporting position according to rotation of the first case 300. That is, when the first case 300 rotates at a specific angle or less from a horizontal state, a top of the first supporter supporting part 730 may retain contact with the first rotation plate 510 and support the first rotation plate 510. On the other hand, when the first case 300 rotates at the specific angle or more in the horizontal state, the top of the first supporter supporting part 730 separates from the first rotation plate 510, and thereby allowing the first rotation plate 510 to rotate to the avoidance position.

The second supporter supporting part 740 may be curl vertically from the other side edge of the bottom cover part 710. The second supporter supporting part 740 may be provided in a curved shape having the same curvature as that of the second rounding part 723 which is provided in the pair of hinge supporting parts 720. When in the unfolded state, the first support supporting part 740 contacts the first stepped surface 523 and restricts the second rotation plate 520 from rotating beyond the unfolded state in the direction opposite to the unfolding direction. The second supporter supporting part 740 may have a height corresponding to a height between a second stepped surface 523 (see FIG. 4) of the second rotation plate 520, which is rotated to the panel supporting position, and the bottom cover part 710. The second supporter supporting part 740 may support the second stepped surface 523 of the second rotation plate 520 and rotate the supported second rotation plate 520 to the panel supporting position according to rotation of the second case 400. That is, when the second case 400 rotates at a specific angle or less in a horizontal state, a top of the second supporter supporting part 740 may overlap with a rotation trajectory of the second rotation plate 520 and support the second rotation plate 520. On the other hand, when the second case 400 rotates at the specific angle or more in the horizontal state, the top of the second supporter supporting part 740 may not obstruct rotation of the second rotation plate 520 without overlapping with the rotation trajectory of the second rotation plate 520, thereby allowing the second rotation plate 520 to rotate to the avoidance position.

The accommodation part 750 may be provided on the bottom cover part 710 by the pair of hinge supporting parts 720 and the first and second supporting parts 730 and 740. The accommodation part 750 may provide a space which enables the first and second panel supporting parts 213 and 223, which are respectively defined in the first and second supporting plates 210 and 220, to rotate between the panel supporting position and the avoidance position according to rotations of the first and second cases 300 and 400. Particularly, the accommodation part 750 may provide a space which enables the bending area 115 of the display panel 100 to be bent in a curved shape (for example, a semicircular shape) having a relatively large curvature according to the display panel 100 being folded. That is, when the display panel 100 is folded, the accommodation part 750 may provide a space where the bending area 115 of the display panel 100 is bent in a curved shape having a large curvature independently from a bending stress and the bent curved shape is stably maintained.

Referring again to FIGS. 2 to 4, the foldable display apparatus according to an embodiment of the present invention may further include a supporter fixing part 800. The supporter fixing part 800 may be provided in each of the first and second cases 300, 400 and the supporter 500. The supporter fixing part 800 may respectively fix the first and second rotation plates 510 and 520 of the supporter 500 to the first and second cases 300 and 400. That is, the supporter fixing part 800 according to an embodiment may fix an avoidance position of each of the first and second rotation plates 510 and 520.

The supporter fixing part 800 according to an embodiment may include a first magnet part 810, which is provided in each of the first and second cases 300 and 400, and a second magnet part 820 which is provided in the supporter 500.

The first magnet part 810 may be disposed on each of the second inner bottom 320 of the first case 300 and the fourth inner bottom 420 of the second case 400. In this case, the first magnet part 810 may include a plurality of magnets which are arranged at certain intervals on the second inner bottom 320 of the first case 300 and the fourth inner bottom 420 of the second case 400.

The second magnet part 820 may be disposed on each of rear surfaces of the first and second rotation plates 510 and 520 overlapping the first magnet part 820. In this case, the second magnet part 820 may include a plurality of magnets which are arranged at certain intervals on the rear surfaces of the first and second rotation plates 510 and 520. The second magnet part 820 may automatically attach to the first magnet part 810 when the first and second plates 510 and 520 approach the respective inner bottoms 320 and 420 of the first and second cases 300 and 400.

The supporter fixing part 800 according to an embodiment may automatically fix the first and second rotation plates 510 and 520 to the respective inner bottoms 320 and 420 of the first and second cases 300 and 400 by using a magnetic attraction between the first and second magnet parts 810 and 820, and thus may maintain or fix a rotation angle of each of the first and second rotation plates 510 and 520 rotated to the avoidance position. That is, as soon as the first and second rotation plates 510 and 520 are released from rotation restriction by the hinge cover 700, the supporter fixing part 800 may automatically attract and fix the first and second rotation plates 510 and 520 to the inner bottoms 320 and 420 of the first and second cases 300 and 400, respectively.

Figure 7:
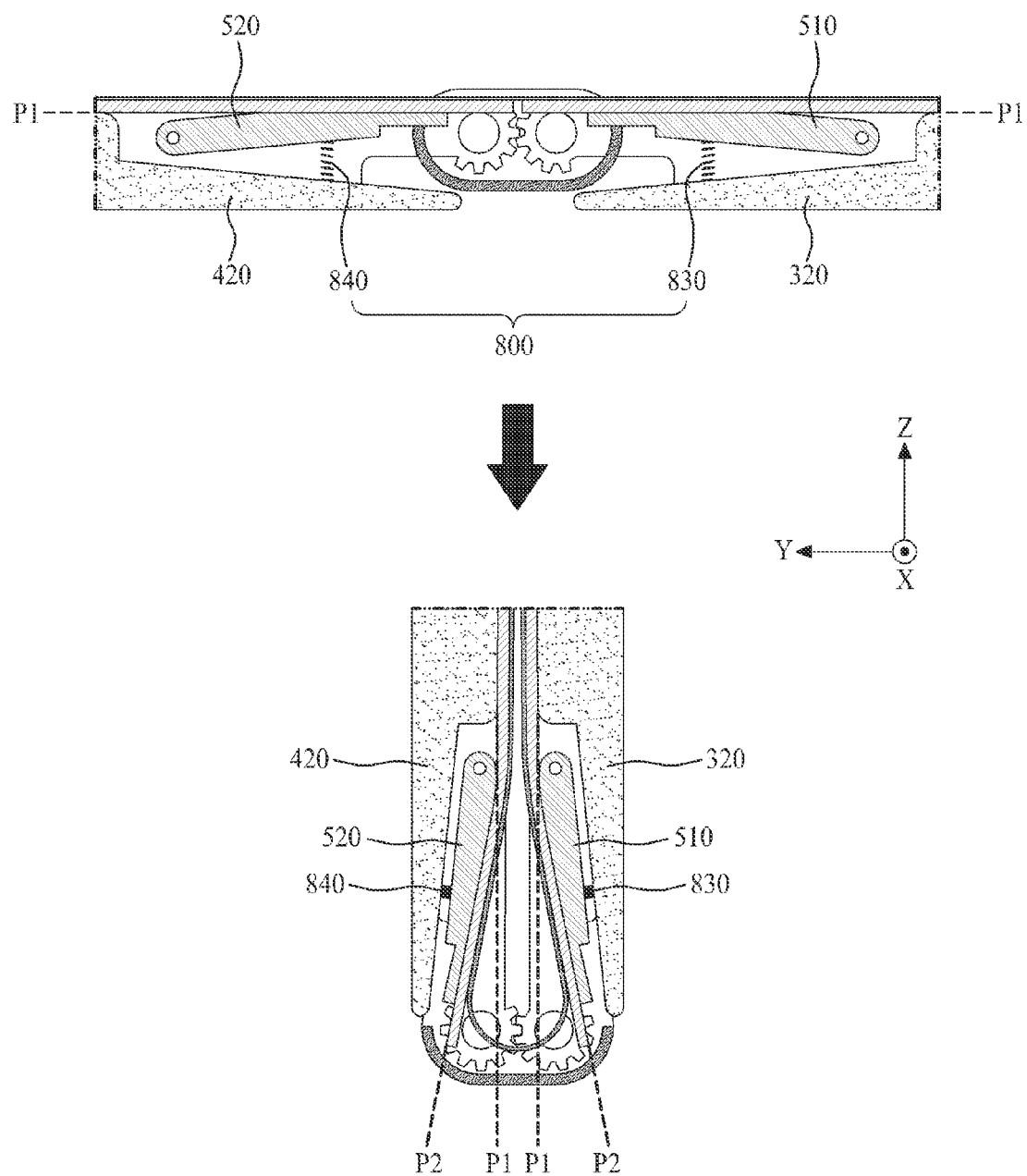
FIG. 7 is a cross-sectional diagram of a foldable display apparatus with supporter fixing parts according to an alternative embodiment of the present invention.

The supporter fixing part 800 according to another embodiment, as illustrated in FIG. 7, may include first and second pull members 830 and 840 having a tensile force. For example, each of the first and second pull members 830 and 840 may be configured with a coil spring or a tensile spring.

The first pull member 830 may be disposed between the second inner bottom 320 of the first case 300 and a rear surface of the first rotation plate 510. The first pull member 830 may automatically attract the first rotation plate 510 to the second inner bottom 320 of the first case 300 by using a tensile force, and thus may maintain or fix a rotation angle of the first rotation plate 510 rotated to the avoidance position. That is, as soon as the first rotation plate 510 is released from restriction by the hinge cover 700, the first pull member 830 may automatically attract and fix the first rotation plate 510 to the second inner bottom 320 of the first case 300.

The second pull member 840 may be disposed between the fourth inner bottom 420 of the second case 400 and a rear surface of the second rotation plate 520. The second pull member 840 may automatically attract the second rotation plate 520 to the fourth inner bottom 420 of the second case 400 by using a tensile force, and thus may maintain or fix a rotation angle of the second rotation plate 520 rotated to the avoidance position. That is, as soon as a rotation trajectory of the second rotation plate 520 is released from restriction by the hinge cover 700, the second pull member 840 may automatically attract and fix the second rotation plate 520 to the fourth inner bottom 420 of the second case 400.

Figure 8:
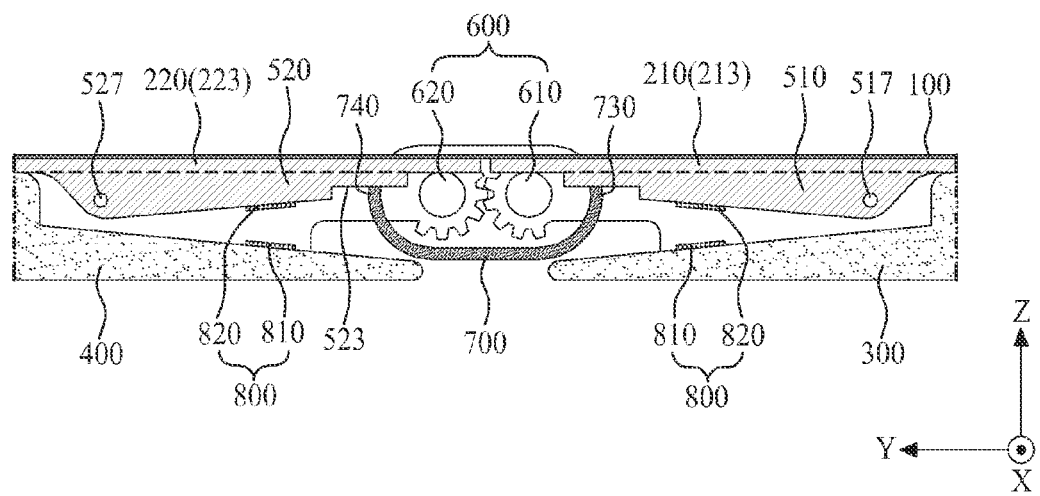
FIG. 8 is a cross-sectional diagram of a foldable display apparatus with the supporters according to an alternative embodiment of the present invention.

As illustrated in FIG. 8, in the above-described foldable display apparatus according to an embodiment of the present invention, the first rotation plate 510 of the supporter 500 may be integrated with a rear surface of the first panel supporting part 213 of the first supporting plate 210. Moreover, the second rotation plate 520 of the supporter 500 may be integrated with a rear surface of the second panel supporting part 223 of the second supporting plate 220. In this case, the first panel supporting part 213 of the first supporting plate 210 may be bent between the panel supporting position and the avoidance position along a bending trajectory with the first pin 517 functioning as a supporting axis. Also, the second panel supporting part 223 of the second supporting plate 220 may be bent between the panel supporting position and the avoidance position along a bending trajectory with the second pin 527 functioning as a supporting axis. Since the first supporting plate 210 is integrated with the first rotating plate 510, and the second supporting plate 220 is integrated with the second rotating plate 520, the embodiment of FIG. 8 provides the same effect as that of a split type structure but reduces the number of elements included in the foldable display apparatus.

In the foldable display apparatus according to an embodiment of the present invention, since the bending area 115 of the display panel 100 which is unfolded into a flat state is supported by the first and second rotation plates 510 and 520 of the supporter 500 and maintained in a flat state, the bending area 115 of the display panel 100 is prevented from being deformed when external pressure is applied to the bending area 115. Further, since the first and second rotation plates 510 and 520 rotate to the avoidance position when the display panel 100 is folded, the bending area 115 of the display panel 100 is bent at a predetermined curvature, thereby reducing bending stress applied to the bending area 115 of the display panel 100. Particularly, in the foldable display apparatus according to an embodiment of the present invention, since the first and second areas 111 and 113 of the display panel 100 are folded to directly face each other due to a foldable structure having an inner bending type, the folded display panel 100 is not externally exposed, and thus, the folded display panel 100 is protected from an external impact.

Figure 9A:
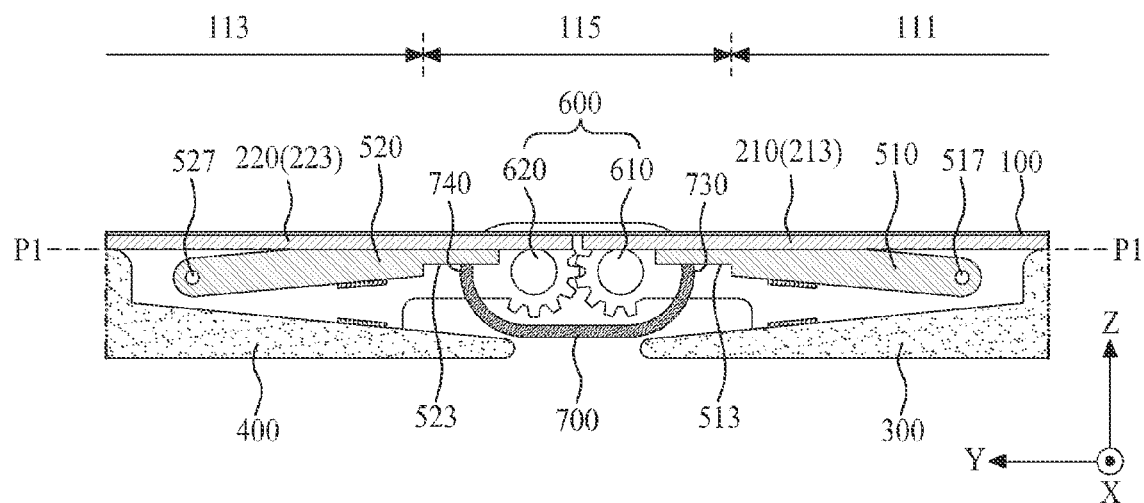
FIGS. 9A through 9E are cross-sectional diagrams illustrating various stages of folding the foldable display apparatus according to an embodiment of the present invention.

FIGS. 9A through 9E are cross-sectional diagrams illustrating various stages of folding the foldable display apparatus according to an embodiment of the present invention. First, as illustrated in FIG. 9A, when the display panel 100 is unfolded, the first and second cases 300 and 400 are placed in a horizontal state. The first and second hinge members 610, 620 of the hinge 60 rotate to the panel supporting position P1. The first and second rotation plates 510, 520 of the supporter 500 rotate to the panel supporting position P1, and the stepped surfaces 513 and 523 of the first and second rotation plates 510 and 520 are supported by the supporter supporting parts 730, 740 of the hinge cover 700. Also, the respective panel supporting parts 213, 223 of the first and second supporting plates 210, 220 extending to the bending area 115 of the display panel 100 are supported by the first and second rotation plates 510, 520. Therefore, the bending area 115 of the display panel 100 in the unfolded state is supported by the supporter 500 and supported by each of the first and second supporting plates 210 and 220 disposed along the same plane, and may be maintained in a flat state. As a result, the bending area 115 does not flex despite pressure caused by a user's touch.

Figure 9B:
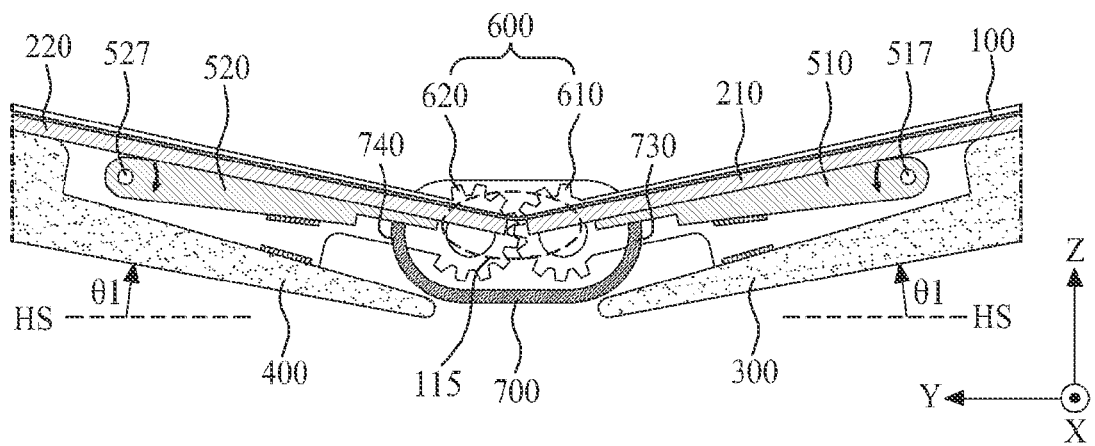

Subsequently, as illustrated in FIG. 9B, when the display panel 100 is rotate by a first angle $\theta1$ relative to a horizontal state HS, the second case 400 also rotate by the first angle $\theta1$ relative to the horizontal state HS. Therefore, when the first and second hinge members 610 and 620 rotate, the first and second rotation plates 510, 520 rotate from the panel supporting position P1 while the first and second rotation plates 510, 520 maintain contact with the supporter supporting parts 730 and 740 of the hinge cover 700. That is, when the first and second hinge members 610 and 620 rotate by the first angle $\theta1$, the center of the bending area 115 of the display panel 100 may be bent with a first curvature and pushes the respective panel supporting parts 213 and 223 of the first and second supporting plates 210 and 220. Due to the pushing of the panel supporting parts 213 and 223, the first and second rotation plates 510, 520 may rotate to a certain angle. In this case, inner edges of the panel supporting parts 213 and 223 and inner edges of the first and second rotation plates 510 and 520 may be disposed in the hinge cover 700.

Figure 9C:
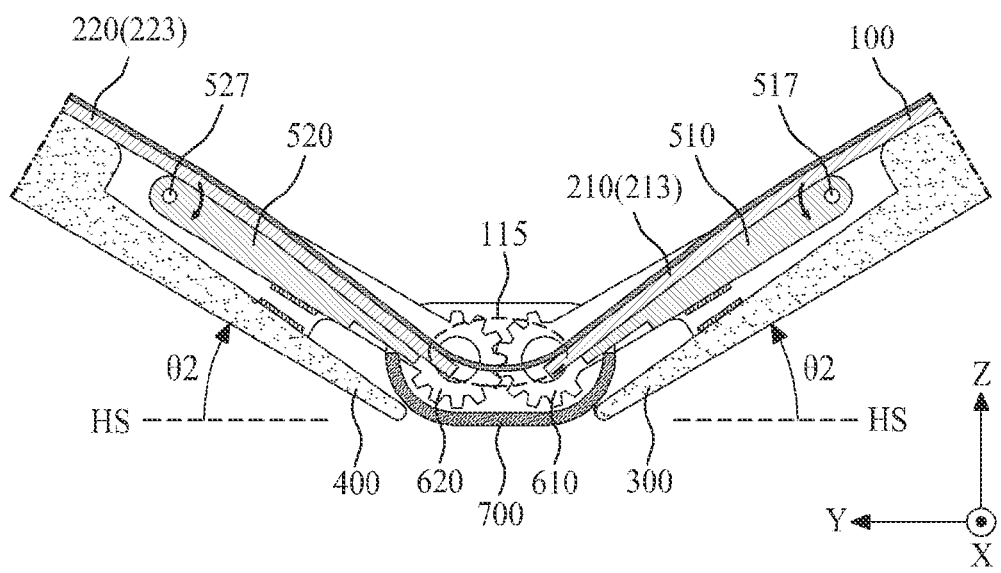

Subsequently, as illustrated in FIG. 9C, when the display panel 100 is folded so that the first case 300 is rotated by a second angle $\theta2$ (where $\theta2>\theta1$) relative to the horizontal state HS, and simultaneously, the second case 400 is also rotated by the second angle $\theta2$ in the horizontal state HS. Therefore, when the first and second hinge members 610 and 620 rotate, the first and second rotation plates 510 and 520 may rotate while being supported by the supporter supporting parts 730 and 740 of the hinge cover 700. That is, the bending area 115 of the display panel 100 may be bent at a second curvature greater than the first curvature and may additionally push the respective panel supporting parts 213 and 223 of the first and second supporting plates 210 and 220. Due to the pushing of the panel supporting parts 213 and 223, the first and second rotation plates 510 and 520 may make further rotation inside the hinge cover 700.

Figure 9D:
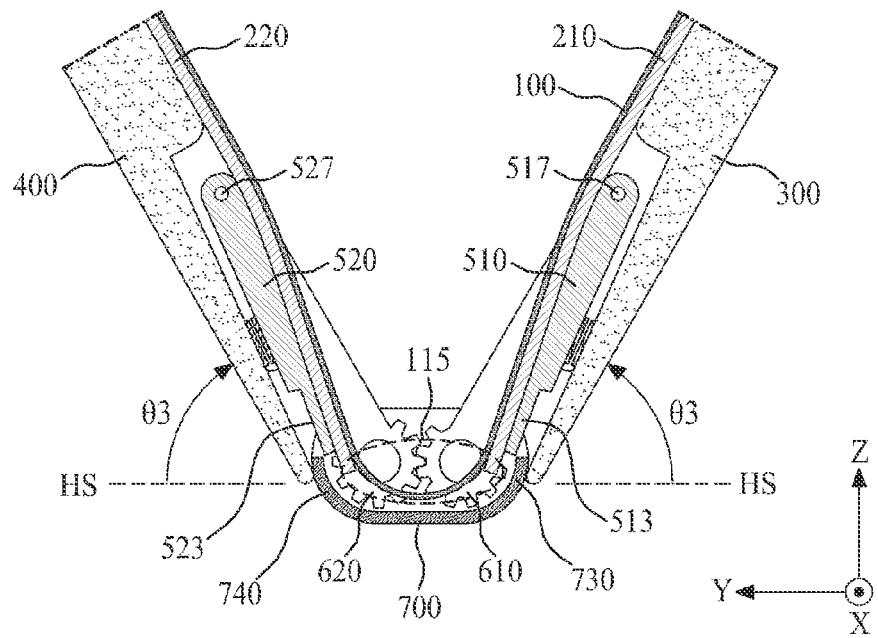

Subsequently, as illustrated in FIG. 9D, when the display panel 100 is folded so that the first case 300 is rotated by a third angle $\theta3$ (where $\theta3>\theta2$) relative to the horizontal state HS, the second case 400 is also rotated by the third angle $\theta3$ relative to the horizontal state HS. Therefore, when the first and second hinge members 610 and 620, the first and second rotation plates 510 and 520 may further rotate. That is, when the first and second hinge members 610 and 620 additionally rotate, the bending area 115 of the display panel 100 is bent at a third curvature greater than the second curvature and may further push the respective panel supporting parts 213 and 223 of the first and second supporting plates 210 and 220. At this rotation angle, the supporter supporting parts 730 and 740 of the hinge cover 700 are no longer in contact with the first and second rotation plates 510 and 520.

Figure 9E:
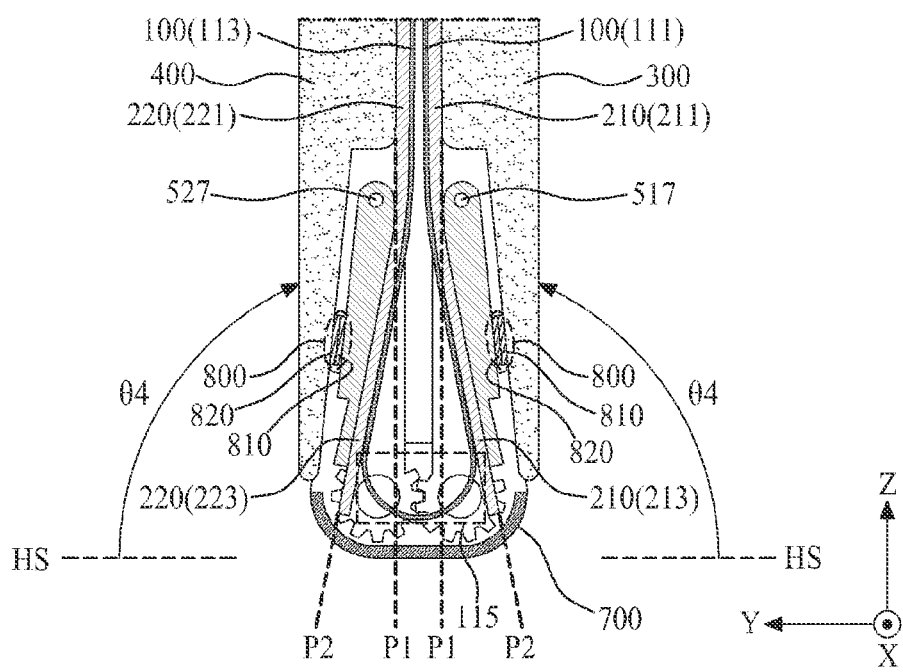

Subsequently, as illustrated in FIG. 9E, when the display panel 100 is completely folded, the first case 300 may rotate by a fourth angle $\theta4$ (where $\theta4>\theta3$) relative to the horizontal state HS, and the second case 400 may rotate by the fourth angle θ4 relative to the horizontal state HS. Therefore, the first and second rotation plates 510 and 520 may be rotated to the avoidance position P2 by respective rotations of the first and second cases 300 and 400 along respective rotation trajectories which do not overlap the supporter supporting parts 730 and 740 of the hinge cover 700, and may be respectively disposed on the supporter supporting parts 730 and 740 of the hinge cover 700.

Moreover, the first and second rotation plates 510 and 520 may become fixed to the first and second cases 300 and 400 by the supporter fixing part 800. That is, when the first and second rotation plates 510 and 520 respectively approach the first and second cases 300 and 400, the second magnet part 820 of the first and second rotation plates 510 and 520 may attach to the first magnet part 810, which is provided in the first and second cases 300 and 400, due to a magnetic attraction between the first and second magnet parts 810 and 820 of the supporter fixing part 800. As a result, the first and second rotation plates 510 and 520 may automatically become fixed to the first and second cases 300 and 400, respectively.

Therefore, when the first and second cases 300 and 400 rotate from the horizontal state HS to a vertical unfolded state, the bending area 115 of the display panel 100 may be bent at a predetermined curvature and may be accommodated in an accommodation part which is provided in the hinge cover 700. In this case, the bending area 115 of the display panel 100 which is bent at a predetermined curvature may be accommodated in a space between the panel supporting parts 213 and 223 of the first and second supporting plates 210 and 220 which are bent to the avoidance position P2 adjacent to the supporter supporting parts 730 and 740 of the hinge cover 700. As a result, the display panel 100 may be folded in the inner bending type where the bending area 115 which is bent at the predetermined curvature is accommodated in the hinge cover 700, and the first and second areas 111 and 113 are folded to face each other and protected by the first and second cases 300 and 400.

The folded display panel 100 may be unfolded to a flat state according to an operation opposite to the above-described folding operation of the display panel 100. However, in the folding operation of the display panel 100, the first and second rotation plates 510 and 520 which are respectively fixed to the first and second cases 300 and 400 by the supporter supporting part 800 may respectively contact the supporter supporting parts 730 and 740 of the hinge cover 700, and thus may be respectively detached from the first and second cases 300 and 400 and may rotate to the panel supporting position. That is, when the respective rotation trajectories of the first and second rotation plates 510 and 520 overlap with the supporter supporting parts 730 and 740 according to rotations of the first and second cases 300 and 400, the first and second rotation plates 510 and 520 may be respectively detached from the first and second cases 300 and 400 by contacting the supporter supporting parts 730 and 740.

As described above, according to the embodiments of the present invention, the bending area of the display panel unfolded to a flat state is maintained in a flat state, thereby preventing the bending area of the unfolded display panel from being deformed by external pressure. Also, the bending area of the display panel which is bent at a certain curvature is accommodated in the hinge cover, thereby safely protecting the bending area of the display panel from an external impact.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A foldable display device comprising:
    a flexible display panel comprising a first display area, a second display area and a bending display area between the first display area and the second display area;
    a first supporting member under the first display area and extending below a first portion of the bending display area to provide support for the first portion of the bending display area in an unfolded state of the foldable display device;
    a second supporting member under the second display area and extending below a second portion of the bending display area to provide support for the second portion of the bending display area in the unfolded state, an edge of the second supporting member under the bending display area separated from an edge of the first supporting member under the bending display area by a predetermined distance in the unfolded state, the second supporting member bent away from the second portion of the bending display area in the folded state to increase a distance between the edge of the first supporting member and the edge of the second supporting member;
    a first rotation plate configured to rotate about a first axis and extend towards the edge of the first supporting member to support a portion of the first supporting member in the unfolded state; and
    a second rotation plate configured to rotate about a second axis parallel to the first axis, the second rotation plate extending towards the edge of the second supporting member to support a portion of the second supporting member in the unfolded state; and wherein the first supporting member stretches and slides relative to the first rotation plate and the second supporting member stretches and slides relative to the second rotation plate when the first case is rotated relative to the second case.

2. The foldable display device of claim 1, further comprising:
    a first case securing a portion of the first supporting member and the first display area;
    a second case securing a portion of the second supporting member and the second display area;
    a first hinge member secured to the first case; and
    a second hinge member secured to the second case and rotatable relative to the first hinge member.

3. The foldable display device of claim 2, further comprising a hinge cover enclosing at least part of the first hinge member and the second hinge member, the hinge cover comprising a first supporter supporting part and a second supporter supporting part, the first supporter supporting part extending across a width of the first rotation plate and configured to support the first rotation plate in the unfolded state, and the second supporter supporting part extending across a width of the second rotation plate and configured to support the second rotation plate in the unfolded state.

4. The foldable display device of claim 3, wherein the first hinge member comprises an end formed with a first gear, and wherein the second hinge member comprises an end formed with a second gear engaging with the first gear.

5. The foldable display device of claim 4, further comprising a first hinge axis member rotatably connecting the first gear to the hinge cover, and a second hinge axis member rotatably connecting the second gear to the hinge cover.

6. The foldable display device of claim 2, further comprising:

a first pin extending along the first axis and rotatably connecting the first rotation plate to the first case; and a second pin extending along the second axis and rotatably connecting the second rotation plate to the second case.

7. The foldable display device of claim 6, wherein the first pin extends through the first hinge member and the second pin extends through the second hinge member.

8. The foldable display device of claim 2, wherein the distance between the edge of the first supporting member and the edge of the second supporting member increases as the first cover and the second cover are rotated away from the unfolded state.

9. The foldable display device of claim 2 wherein a surface of the first rotation plate supporting the first supporting member and a surface of the second rotation plate supporting the second supporting member are flat.

10. The foldable display device of claim 2, further comprising:

a first supporter fixing structure between the first rotation plate and the first case, the first supporter fixing structure configured to apply force to the first rotation plate to rotate in a direction that pulls a portion of the first rotation plate supporting the first supporting member towards a bottom surface of the first case; and a second supporter fixing structure between the second rotation plate and the second case, the second supporter fixing structure configured to apply force to the second rotation plate to rotate in a direction that pulls a portion of second rotation plate supporting the second supporting member towards a bottom surface of the second case.

11. The foldable display device of claim 10, wherein the first and second supporter fixing structures comprise a spring or a magnet.

12. The foldable display device of claim 2, further comprising:

a first adhesive member between the first display area and a coupling part of the first supporting member;

a second adhesive member between the second display area and a coupling part of the second supporting member;

a third adhesive member between the coupling part of the first supporting member and a surface of the first case; and a fourth adhesive member between the coupling part of the second supporting member and a surface of the second case.

13. The foldable display device of claim 1, wherein the flexible display panel is placed between the first supporting member and the second supporting member in a folded state.

14. The foldable display device of claim 1, wherein the first supporting member and the first rotation plate are integrated into a single body, and the second supporting member and the second rotation plate are integrated into another single body.

15. A method of folding or unfolding a foldable display device comprising:

supporting a first display area of a flexible display panel by a first case;

supporting a second display area of the flexible display panel by a second case;

supporting a first portion of a bending display area between the first display area and the second display area by a first supporting member under the first display area and extending below the first portion of the bending display area in an unfolded state of the foldable display device;

supporting a second portion of the bending display area by a second supporting member under the second display area and extending below the second portion of the bending display area in the unfolded state;

rotating, about a first axis, a first rotation plate supporting a portion of the first supporting member in the unfolded state;

rotating, about a second axis parallel to the first axis, a second rotation plate that supports a portion of the second supporting member in the unfolded state; and bending the second supporting member away from the second portion of the bending display area to increase a distance between an edge of the first supporting member and an edge of the second supporting member with rotation of the first case and second case away from the unfolded state to cause the bending display area to bend at a predetermined curvature in a folded state of the foldable display device; and sliding and stretching the first supporting member relative to the first rotation plate during rotation of the first case relative to the second case; and sliding and stretching the second supporting member relative to the second rotation plate during the rotation of the first case relative to the second case.

16. The method of claim 15, further comprising:

supporting a first hinge member connected to the first case and a second hinge member connected to the second case by a hinge cover in the unfolded state; and engaging the first hinge member with the second hinge member during rotation of the first case relative to the second case.

17. The method of claim 15, further comprising:

applying force by a first supporter fixing structure to the first rotation plate to rotate the first rotation plate in a direction that pulls a portion of the first rotation plate supporting the first supporting member towards a bottom surface of the first case; and applying force by a second supporter fixing structure to the second rotation plate supporting the second supporting member to rotate the second rotation plate in a direction that pulls a portion of second rotation plate towards a bottom surface of the second case.

18. The method of claim 15, wherein the bending display area of the flexible display panel is placed between the first supporting member and the second supporting member in a folded state.

* * * * *